United States Patent [19]

Hauser, Jr. et al.

[11] 4,142,004
[45] Feb. 27, 1979

[54] METHOD OF COATING SEMICONDUCTOR SUBSTRATES

[75] Inventors: Victor E. Hauser, Jr., Palmerton, Pa.; Ashok K. Sinha, Murray Hill, N.J.

[73] Assignee: Bell Telephone Laboratories, Incorporated, Murray Hill, N.J.

[21] Appl. No.: 651,556

[22] Filed: Jan. 22, 1976

[51] Int. Cl.² .................. B05D 1/08; B05D 5/12; C23C 11/08

[52] U.S. Cl. .................. 427/39; 29/576 R; 29/584; 118/49.5; 204/192 S; 427/94; 427/95; 427/248 B

[58] Field of Search .................. 427/34, 82, 88, 89, 427/90, 91, 94, 39, 248; 29/576 R, 584; 118/49.5, 70; 204/192 C, 192 S

[56] References Cited

U.S. PATENT DOCUMENTS

| B 554,164 | 3/1976 | Graul et al. | 427/94 |
|---|---|---|---|
| 3,485,666 | 12/1969 | Sterling et al. | 427/248 X |
| 3,637,423 | 1/1972 | Sestrich | 427/94 |
| 3,652,324 | 3/1972 | Chu et al. | 427/94 |
| 3,672,983 | 6/1972 | De Witt et al. | 427/94 |
| 3,757,733 | 9/1973 | Reinburg | 118/49.5 |
| 3,900,944 | 8/1975 | Fuller et al. | 29/578 |
| 3,961,103 | 6/1976 | Aisenberg | 427/34 |

OTHER PUBLICATIONS

Hu et al., "Deposition of Silicon Nitride by RF Sputtering in Ammonia and Argon Mixture", in IBM Technical Disclosure Bulletin, vol. 10, No. 2, p. 100.

Primary Examiner—George F. Lesmes
Assistant Examiner—R. Eugene Varndell, Jr.
Attorney, Agent, or Firm—Irwin Ostroff

[57] ABSTRACT

A low-temperature, high-pressure, medium-power process, which utilizes a radio frequency powered radial flow reactor, utilizes only silane and ammonia as the reactant gases for deposition. The methods disclosed result in the deposition on semiconductor wafers of moderately high density silicon-nitrogen films which have low tensile stress and good crack resistance. In addition, these films provide good step coverage, good scratch resistance, and an inert barrier to sodium and moisture.

1 Claim, 8 Drawing Figures

METHOD OF COATING SEMICONDUCTOR SUBSTRATES

BACKGROUND OF THE INVENTION

This invention relates to methods for depositing coatings on suitable substrates utilizing a radio frequency (rf) powered radial-flow reactor in which laminar flow of reactant gases in a radial direction over a surface is utilized.

The reliability of semiconductor devices, particularly metal oxide silicon semiconductor devices (MOS), is largely a function of the manner in which these devices are passivated and how the completed devices are isolated from the environment. Two of the main problems associated with semiconductor devices are moisture and sodium contamination. Both these elements tend to attack unprotected semiconductor devices and can lead to a failure of the device. Some passivation layers are utilized to protect the surface of the semiconductor device from handling during the fabrication thereof and to provide an electrical isolation barrier. Generally, devices with this kind of passivation layer are packaged in hermetically sealed units in order to prevent sodium and moisture damage.

The relatively high cost of hermetic packaging and the testing associated therewith present a serious economic problem. Many of today's integrated circuit chips cost significantly less than the hermetic packages used to house these chips. It has become very desirable to provide a covering film which will not only protect semiconductor chips from mishandling, but will insulate the chips against moisture and undesirable impurities such as sodium. Semiconductor chips utilizing such a protective film could be placed in relatively inexpensive packages (i.e., nonhermetic plastic packages). This would significantly reduce the total cost of the packaged chip.

One commonly used passivation layer on aluminum metallized semiconductor chips is a phosphosilicate glass film which acts as a getter for sodium. One of the problems with this film is that it has a tendency to react with moisture and from phosphoric acid as a result thereof. This tends to corrode the aluminum metallization. One other problem is that the metallized films deposited subsequent to the film's deposition do not tend to adhere well to the protective film and, therefore, both moisture and sodium damage can occur in the areas of poor adherence. These films are typically deposited by a chemical vapor deposition (CVD) process. Physical steps occurring on the semiconductor chip surface can be poorly covered by these films and, as a result, some areas of the semiconductor surface have little or no protective covering. Contamination of the semiconductor chips at or near these uncovered areas is very likely.

It is known that silicon nitride films provide not only an electrical barrier but also a barrier to sodium as well as moisture. One of the problems of using a CVD process to deposit silicon nitride films is that the temperature range used is generally 700 to 900 degrees C. This poses a problem because aluminum metallization has a melting point of approximately 660 degrees C. Still further, CVD-deposited films have relatively high tensile stresses and, consequently, they tend to crack if made thicker than a few thousand angstroms.

Various publications indicate methods of depositing silicon nitride at temperatures below 450 degrees C., using an rf plasma to provide some of the activation energy used for the reaction of silane and ammonia or silane and nitrogen, or a combination of silane, ammonia and nitrogen. Other publications show the use of a quartz tube, and inductively coupled plasma, and gases flowing at a pressure of approximately 100 microns. These conditions generally result in poor uniformity of film layer thickness, from semiconductor wafer to semiconductor wafer, and of inadequate step coverage.

The *IBM Technical Disclosure Bulletin* of July, 1967, Vol. 10, No. 2, p. 100, discloses the use of an rf reactive sputtering technique for depositing a layer of silicon nitride by utilizing a silicon cathode and a gaseous mixture of ammonia and argon. The publication points out the advantage of using ammonia over pure nitrogen. However, the resulting silicon nitride film tends to have poor step coverage and the relatively high power utilized in conjunction with the low pressure required for sputtering can result in X-rays which tend to damage the semiconductor devices. The difficulties of this kind of system are clearly pointed out in U.S. Pat. No. 3,565,674, lines 6–11.

U.S. Pat. No. 3,757,733, Reinberg, describes a radial flow reactor which is utilized to deposit silicon-nitrogen films on semiconductor wafers. The apparatus described represents an improvement over prior art apparatus and illustrates that contrary to prior thinking, rf plasma deposition of silicon-nitrogen films can be achieved without undue complexity and expense. The gases described for use in Reinberg's apparatus are silane and nitrogen contained in the carrier gas argon. One of the problems we have experienced with this system is that the films produced have relatively low densities and high tensile stresses. This combination of low density and high tensile stress leads to a tendency for the films to crack during subsequent relatively high temperature processing steps as are normally required during the attaching of the semiconductor chip to a lead bearing package. These characteristics tend to limit the useful thickness of the film to a few thousand angstroms in order to prevent excessive cracking and it is often desirable to have thicker films for good coverage over the steps in the semiconductor chip.

It has been found that the use of ammonia with silane and nitrogen tends to improve the quality in the resulting silicon-nitrogen film; however, film cracking still is a serious problem.

It would be desirable to be able to produce a silicon-nitrogen film on the surface of semiconductor devices which provides protection against handling, which has good electrical isolation, step coverage and good resistance to cracking upon heating, and which can be deposited to thicknesses of approximately 1 micron without any resulting cracking.

SUMMARY OF THE INVENTION

To this end, the present invention is a method for coating substrates by plasma deposition in a radio frequency (rf) powered nonsputtering type of radial flow reactor. The reactant gases utilized are silane and ammonia in an inert carrier gas such as argon. Careful precautions, such as the use of stainless steel interconnections, are utilized to minimize the likelihood that gases such as $N_2$ and $O_2$ enter the reactor during the deposition process. A relatively high gas flow rate of typically 2320 sccm and a relatively high dynamic pressure of 950 microns are utilized.

The protective films deposited by use of the above-described method have relatively low tensile stress and therefore tend to be resistant to cracking. These crack-resistant films protect substrates and thus eliminate the need to mount the substrates in hermetically sealed packages and permits the mounting thereof in much less expensive packages. This process is particularly advantageous for use with semiconductor wafers. The films deposited on semiconductor wafers provide high crack resistance, good step coverage and scratch resistance, and an inert barrier to sodium and moisture.

Semiconductor wafers using aluminum metallization are heated to a temperature of typically 330 degrees C. during the deposition process. Semiconductor wafers using gold metallization with titanium, platinum or palladium and gold beam leads are heated to a temperature of typically 275 degrees C. during the deposition process. The silane and ammonia mixture utilized allows for considerable variation of such process parameters as input rf power, substrate temperature, dynamic pressure and gas flow rate.

These and other features and advantages of the invention will be better understood from a consideration of the following detailed description taken in conjunction with the accompanying drawings.

DETAILED DESCRIPTION

Figure 1:
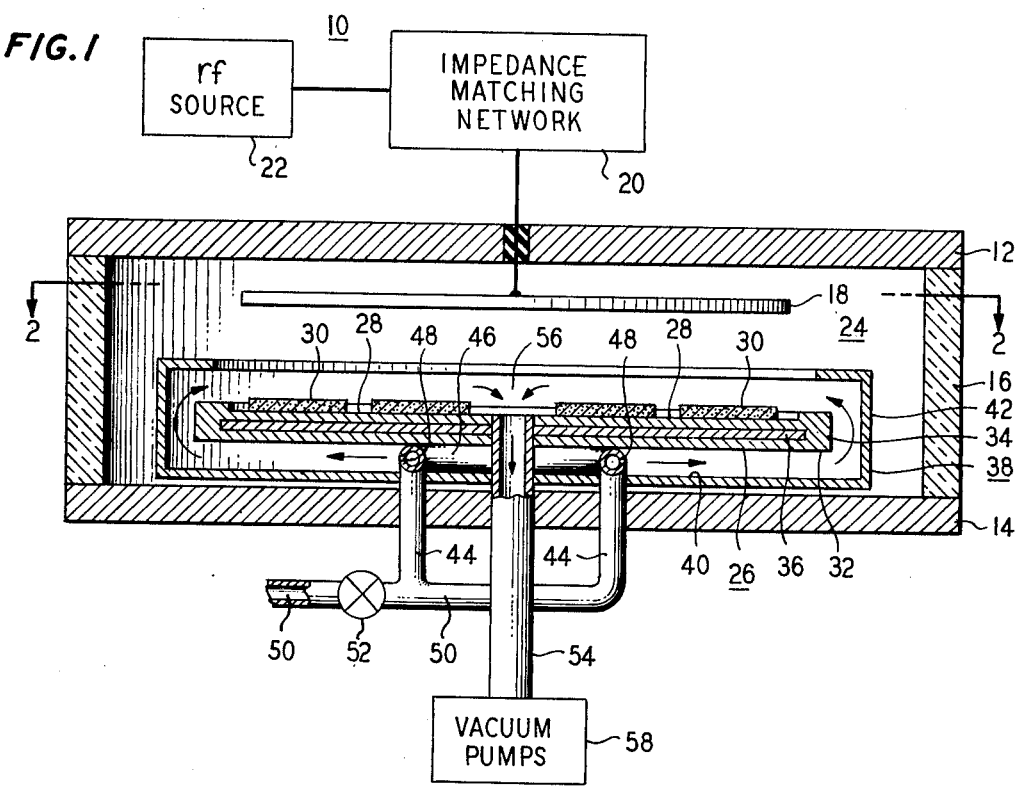
FIGS. 1 and 2 illustrate a radial flow reactor particularly useful in the method of the present invention.
Figure 2:
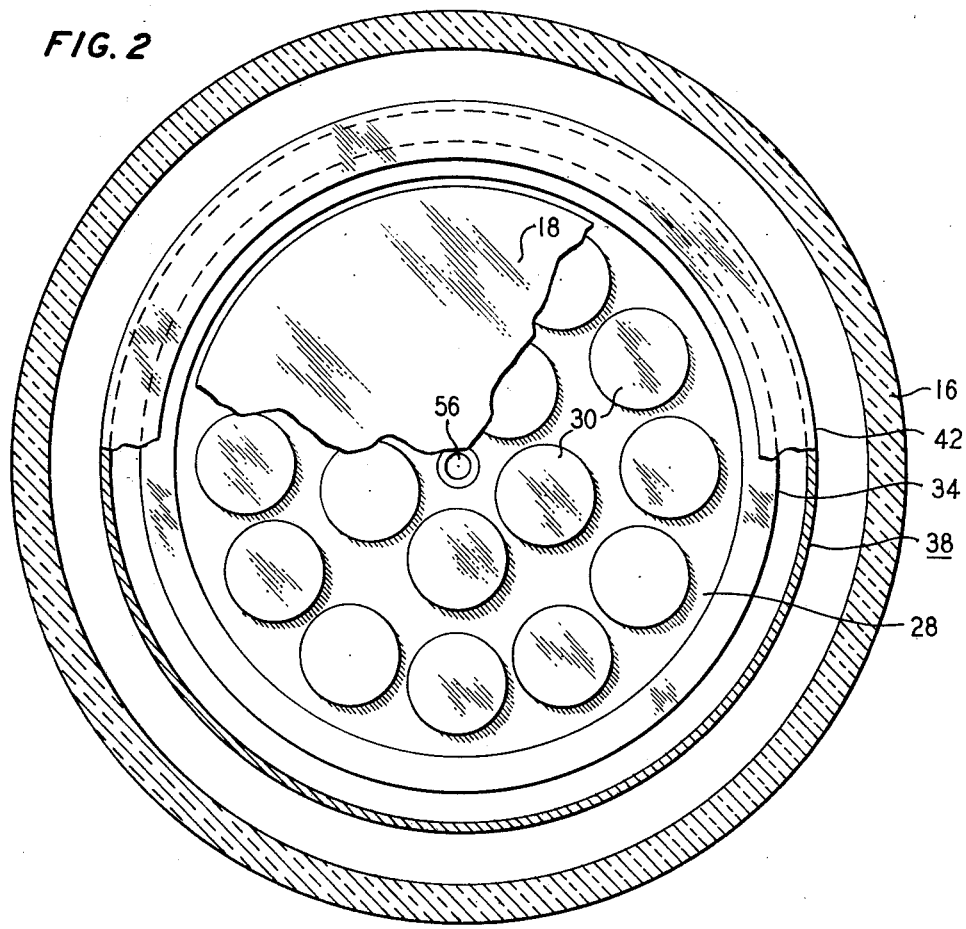

Referring now to FIGS. 1 and 2, there is illustrated in a cross-section and a top view a cylindrical radial flow radio frequency (rf) powered reactor 10. This reactor is more fully described and claimed in an application, denoted as Alexander-Capio-Hauser-Levinstein-Mogab-Sinha-Wagner, Case 1-1-4-16-2-5-16, Ser. No. 651,555, filed at the same time and having the same assignee as the instant invention. Reactor 10 comprises a top plate section 12, a bottom plate section 14, and cylindrical side wall 16. Side wall 16 is connected to the top and bottom of plates 12 and 14 in a sealing relationship to define an evacuable chamber 24.

A first electrode 18, which is typically a circular metallic member, is coupled to an rf source 22 through an impedance matching network 20. Electrode 18 is illustrated as electrically isolated from top plate 12. A second electrode 26, which is typically a circular metallic member, comprises a top surface 28, which is adapted to support semiconductor wafers 30, a bottom portion 32, and an end portion 34. Heaters 36, which are typically contained with electrode 26, are utilized to heat the semiconductor wafers 30 to a preselected temperature.

A gas flow shield 38 is closely spaced to electrode 26 and essentially surrounds electrode 26 except for the portion of the top surface 28 thereof on which the semiconductor wafers 30 are placed. A bottom portion 40 of shield 38 is essentially parallel to bottom portion 32 of electrode 26. A U-shaped end portion 42 of shield 38 surrounds the end portion 34 of electrode 26.

A plurality of sheaths or tubes 44 communicate with the internal portion of chamber 24 extending through the bottom plate 14 and bottom portion 40 of shield 38 in a sealing relationship. Sheaths 44 are coupled at first ends thereof to a gas ring 46 which has a plurality of essentially equally spaced small apertures 48 therethrough. Gas ring 46 exists in the cavity between the bottom portion 32 of electrode 26 and the bottom portion 44 of gas shield 38. Sheaths 40 are connected by second ends thereof to a common sheath (tube) 50 which has a control valve 52 connected in series therewith.

A sheath 54 communicates with the interior of chamber 24 and extends through 14 and 38 in sealing relationship and contacts electrode 26. Electrode 26 has a central region generally at 56 which defines an aperture therethrough. Sheath 54 extends to this aperture and terminates at the top surface 28 of electrode 26. The other end of sheath 54 is coupled to vacuum pumps 58 that are used to evacuate the interior of chamber 24.

The reactant gases required to coat the semiconductor wafers 30 contained within chamber 24 are introduced into tube 50 and flow as indicated by the arrows.

An rf glow discharge reaction is caused to occur within chamber 24 between electrodes 18 and 26 when the rf source 22 is activated and appropriate gases are introduced into chamber 24 through 50. Gas shield 38 is typically spaced ¼" or less from electrode 26. This close spacing substantially inhibits the glow discharge reaction which occurs between electrode 18 and the top surface 28 of electrode 26 from occurring around end portion 34 and bottom portion 32 of electrode 26. This serves to intensify the rf glow discharge reaction immediately above semiconductor wafers 30. In addition, the gas shield 38 permits the effective use of higher input rf power than is possible without the shield. Without shield 38 there is a tendency for the gases introduced into the chamber 24 to react below electrode 26 and therefore to dissipate before reaching semiconductor wafers 30. Thus, without the shield 38 the increasing of rf power beyond a certain point is not particularly helpful in intensifying the glow discharge reaction above the wafers 30 where it is important that the reaction occur.

The vacuum pumps of FIG. 1 are selected to be compatible with a high gas flow rate of approximately 2 liters per minute at greater than 1 mm pressure. A 150 cfm Leybold-Hereaus roots blower backed with two 17 cfm mechanical pumps running in parallel were found to be sufficient to achieve the needed high gas flow rate. Additional pumping capacity comprising a cryopanel and a 400 l/s vacuum pump located below an isolation value (not illustrated) in the reactor 10 of FIGS. 1 and 2 is utilized to initially pump the reactor 10 to a base pressure of $\approx 10^{-6}$mm.

In operation, semiconductor substrates 30 are loaded on support surface 28. The reactor 10 is then sealed, closed, and pumped down to $10^{-6}$mm. The heaters connected or part of the electrode 26 are turned on and the semiconductor substrates are heated to approximately 275 degrees C. The Vacion isolation valve is closed and reactant gases are admitted to the reactor and the roots blower valve is opened again. A dynamic pressure of approximately 600$\mu$ is established in the reactor with the input gases flowing at the desired flow rates. Thereafter the roots blower valve is throttled to the desired pressure. The rf power source is now activated to the desired power level.

Figure 3:
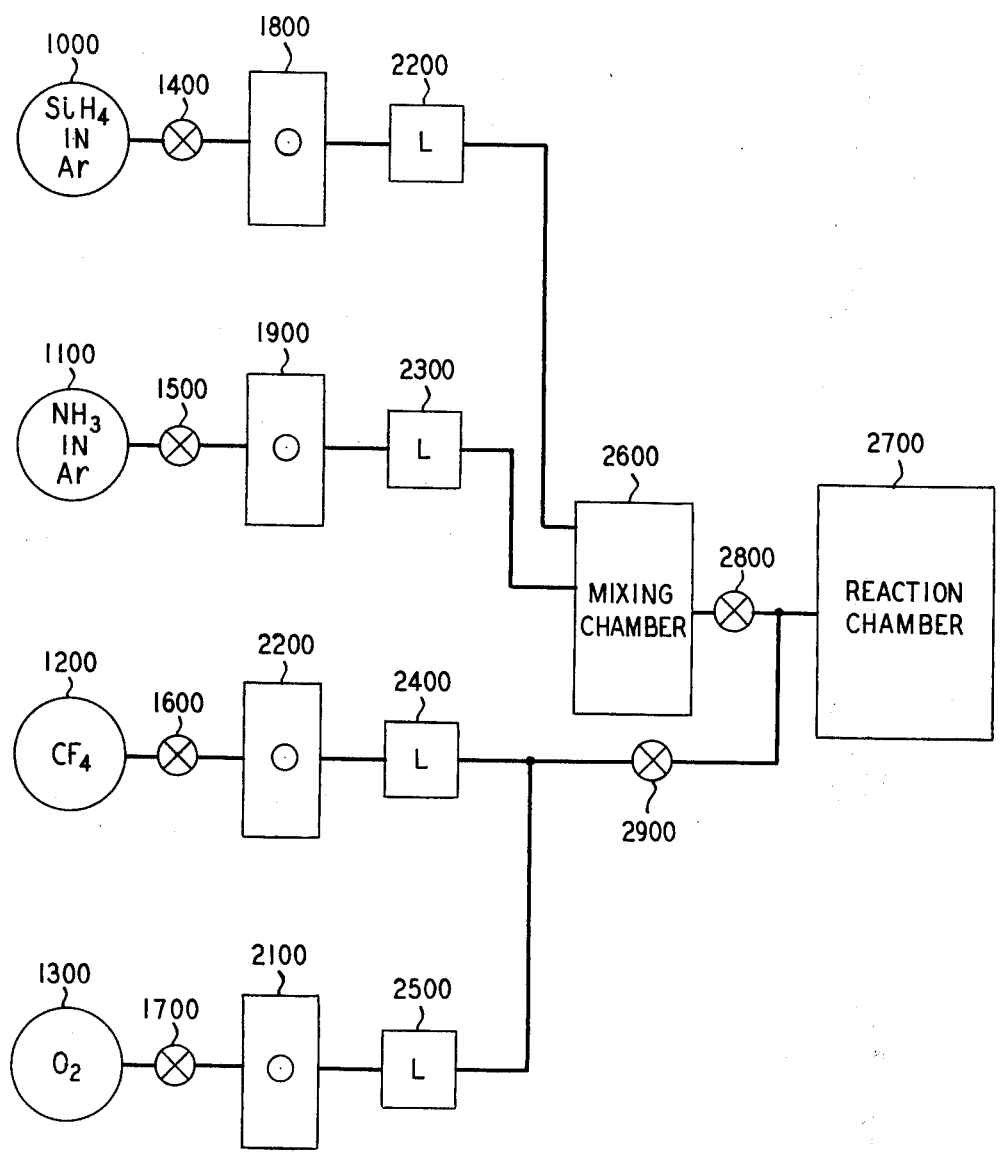
FIG. 3 illustrates a flow diagram of gases that may be used with the reactor of FIGS. 1 and 2.

Referring now to FIG. 3, there is illustrated a flow diagram of reactant gases that may be used in the reactor of FIGS. 1 and 2. Sources of silane (SiH$_4$) in a carrier gas argon (Ar) 1000, ammonia (NH$_3$) in a carrier gas argon (Ar) 1100, carbon tetrafluoride (CF$_4$) 1200, and oxygen (O$_2$) 1300, are connected through a separate one of valves 1400, 1500, 1600 and 1700, respectively, to separate flow meters 1800, 1900, 2000 and 2100, respectively, and then through separate leak valves 2200, 2300, 2400 and 2500, respectively. The outputs of leak valves 2400 and 2500 are both connected through a valve 2900 to a reaction chamber 2700. Reaction chamber 2700 can be the chamber 24 of FIGS. 1 and 2. The outputs of leak valves 220 and 2300 are both connected to mixing chamber 2600. Mixing chamber 2600 is in communication with reaction chamber 2700 through valve 2800.

The reactant gases SiH$_4$ and NH$_3$ mix in the mixing chamber 2600 and then pass through valve 2800 into reaction chamber 2700. During the time of depositing inorganic films on semiconductor substrates, valves 1600, 1700, 2400, 2500 and 2900 are closed and valves 1400, 1500, 2200, 2300 and 2800 are open.

After one or more deposition runs, inorganic films form on the electrodes 18 and 26 and on other areas in the reactor of FIGS. 1 and 2. To clean off the films, the heaters and rf source of FIG. 1 are turned on and valves 1600, 1700, 2400, 2500 and 2900 are all opened, and valves 1400, 1500, 2200, 2300 and 2800 are all closed. The films deposited on internal parts of the reactor are cleaned by the resulting rf glow discharge reaction (the reactant gases being CF$_4$ and O$_2$) and a new set of semiconductor wafers can then be placed in the reactor for deposition of protective films thereon.

Advantageously all interconnecting tubing connecting the sources of gases illustrated in FIG. 3 to the reactor of FIGS. 1 and 2 are made of stainless steel to insure these connections are essentially leak-free. This essentially prevents any but the desired gases from entering the system during the deposition operations. Essentially pure sources of SiH$_4$, NH$_3$, and Ar could be easily substituted for the SiH$_4$ in Ar and NH$_3$ in Ar sources.

The method of the present invention has also been practiced with a radial flow reactor similar to that described except that it did not include a gas shield and has electrode 18 in electrical contact with top plate 12. Side wall 16 is pyrex in this case. The following operating conditions were utilized to deposit protective films having the denoted characteristics on semiconductor substrates:

| | 1st Operating Condition (using apparatus of FIGS. 1 & 2 without gas shield) | 2nd Operating Condition (using apparatus of FIGS. 1 & 2) |
| --- | --- | --- |
| Reactant gas | SiH$_4$/NH$_3$/Ar | SiH$_4$/NH$_3$/Ar |
| SiH$_4$ | 1.25% | 1.70% |
| NH$_3$ | 1.56% | 2.39% |
| Ar | 97.19% | 95.91% |
| Total gas flow (SCCM) | 2000 | 2320 |
| Pressure in reaction ($\mu$) | 1000 | 950 |
| Substrate temperature (degrees C) | 330 | 275 |
| Tuned RF - power (watts) (reflected power = ~0) | 60 | 250 |
| Thickness ($\mu$) of deposited layer ($\mu$) | 1.1 | 1.1 |
| Stress in resulting layer ($10^9 \frac{dynes}{Cm^2}$) | 1-2 (tension) | 1-5 (tension) |
| Etch rate in BHF (Angstroms per min.) | 175 | 180 |
| Density (GCM$^{-3}$) | 2.4 | 2.55 |
| Composition of resulting layer (Si/N) | 1.1 | 1.05 |
| Refractive Index | 2.15 | 2.05 |
| Cracking resistance (deg. C to which substrates with deposited layers could be raised without cracking) | 400 | 450 |
| Adhesion of deposited layer | Good | Good |
| Step Coverage of deposited layer | Very good | Very good |
| Scratch resistance | Good | Good |
| Dielectric constant | 6.9 | 6.4 |
| Breakdown strength ($10^6$ V/cm) | 3.4 | 3.9 |
| Resistivity at $3 \times 10^6$ V/cm (ohm/cm) | $5 \times 10^{12}$ | $4 \times 10^{13}$ |
| | 3rd Operating Condition (using apparatus of FIGS. 1 & 2) | 4th Operating Condition (using apparatus of FIGS. 1 & 2) |
| Reactant gas | SiH$_4$/NH$_3$/Ar | SiH$_4$/NH$_3$/Ar |
| SiH$_4$ | 1.78% | 1.78% |
| NH$_3$ | 2.25% | 2.25% |
| Ar | 95.97% | 95.97 |
| Total gas flow (SCCM) | 2320 | 2320 |
| Pressure in reactor ($\mu$) | 950 | 950 |
| Substrate temperature (degrees C) | 275 | 275 |
| Tuned RF - power (watts) (reflected power = ~0) | 300 | 400 |
| Thickness | 1.1 | 1.1 |
| Stress in resulting layer ($10^9 \frac{dynes}{Cm^2}$) | 1-2 (compression) | 1-2 (compression) |
| Etch rate in BHF (Angstrons per min) | 125 | 75 |
| Density (GCM$^{-3}$) | 2.75 | 2.90 |
| Composition of resulting layer (Si/N) | 0.8 | 0.75 |
| Refractive Index | 2.00 | 1.94 |

| | -continued | |
|---|---|---|
| Cracking resistance (deg. C to which substrates with deposited layers could be raised without cracking) | 550 | 550 |
| Adhesion of deposited layer | Good | Good |
| Step Coverage of deposited layer | Very good | Very good |
| Scratch resistance | Good | Good |
| Dielectric constant | 6.8 | 5.8 |
| Breakdown strength ($10^6$ V/cm) | 5.0 | 8.1 |
| Resistivity at $2 \times 10^6$ V/cm (ohm/cm) | $3 \times 10^{15}$ | $5 \times 10^{19}$ |

The tuned rf power indicated for each of the above operating conditions was read from a meter on the rf power supply. It is to be appreciated that the effective rf input power density between the electrodes of a reactor is a function of the geometry of the electrodes and the spacing therebetween. The reactors utilized with the above operating conditions have a circular top electrode having a radius of 14 inches. Electrode 18 was separated from the electrode 26 by approximately 1". A reactor with different type or size of electrodes and different spacing between electrodes would require a corresponding input rf power in order to produce films on semiconductor wafers with essentially the same characteristics as described herein.

The first operating condition is useful for depositing protective films on semiconductor wafers which utilize aluminum metallization. The aluminum metallization can easily withstand temperatures at and above the 330 degrees C. used. The second through fourth operating conditions can be used with semiconductor wafers which have aluminum or gold with titanium, palladium and gold beam leads since the temperature utilized is below that at which titanium and palladium and gold intereact.

Cracking of the protective films allows moisture and impurities (i.e., sodium) to attack the surface of the semiconductor wafer and thereby destroy the circuitry contained thereon. It is therefore very important that protective films be as crack-resistant as possible.

The fourth operating condition results in films which are substantially stoichiometric silicon nitride ($Si_3N_4$) and which contain essentially no other organic combinations or argon incorporation. The specific characteristics leading to stoichiometric silicon nitride films are described and claimed in a separate application, denoted as Levinstein-Sinha-Wagner Case 17-6-17, Ser. No. 651,557, filed at the same time and having a common assignee as the instant application. The physical characteristics of the resulting $Si_3N_4$ film are superior to $Si_3N_4$ films produced by chemical vapor deposition (CVD) processes in that they are much less susceptible to cracking than the CVD produced $Si_3N_4$. The reason for this is that the silicon nitride films resulting from operating condition four have relatively low compressive stress and not the relatively high tensile stress of the CVD produced films.

It is important to note that in all of applicants operating conditions careful precautions were taken to limit the presence of nitrogen ($N_2$) or oxygen ($O_2$) in the reactor during the glow discharge reactions. It has been determined through experimentation that the addition of even small amounts of $N_2$ (up to 2%) or $O_2$ (up to 0.2%) in the reactant gas mixture can significantly adversely affect the characteristics of the resulting films. The addition of only 2% nitrogen to the reactant gases resulted in an order of magnitude increase in tensile stress of the resulting film, and an increase in the BHF etch rate of over 7 times. The addition of only 0.2% $O_2$ to the reactant gases resulted in a 7 times increase in the BHF etch rate. Accordingly, it is desirable to keep the nitrogen and oxygen levels at least below such amounts and it appears advantageous to keep the levels as low as it is economically practical.

It has been observed that utilizing the methods of the present invention had on occasion resulted in sporadic nodular growths or hillocks in the films deposited on some semiconductor wafers. A high correlation is believed to exist between contamination of the surface of semiconductor wafers by carbon (from baked-on residues of inactive photoresist) and/or particulate matter and the occurrence of nodular growths. It is believed that the presence of contamination on the surface of semiconductor wafers causes a gas-phase reaction in the vicinity of the contaminated area which results in the nodular growths. Such gas-phase reactions in response to surface contamination are found to be more likely to occur under conditions of temperatures in excess of 200 degrees C. and flow rates of greater than 1000 sccm. It is important that surface contamination be attenuated because the methods of the present invention utilize such temperatures and flow rates.

A method of cleaning semiconductor wafers prior to the deposition of protective films thereon has been found to be particularly effective in essentially eliminating all nodular growth. After the semiconductor wafers have been processed through metallization, but before any standard metallization-bake process, the following cleaning process may be utilized.

1. Carefully strip all inactive photoresist using J100 or A30 stripper wherever practical.
2. Remove any residual carbon by boiling in a mixture of 90% $H_2O$ and 10% $H_2O_2$ for 10 minutes followed by a de-ionized $H_2O$ rinse (15 minutes or longer).
3. Perform the standard metallization-bake process (e.g. aluminum 450 degrees C. in $H_2$ for ½ hour; Ti/Pd/Au 250 degrees C. in forming gas for 16 hours; Ti/Pt/Au 325 degrees C. in forming gas for about 3 hours).
4. Reclean by scrubbing both sides of the semiconductor wafer in triton X (1:20,000 dilution) followed by a mixture of 90% $H_2O$ and 10% $H_2O_2$ followed by a $H_2O$ rinse (15 minutes or longer).

With the above-described cleaning process it has been found that nodular growth has been essentially eliminated on at least several hundred semiconductor wafers which were coated with protected films by the methods of the present invention.

After the protective coating has been deposited on the semiconductor wafers they are removed from the reactor. Contact windows are now opened in the protective coating to the metallization below to facilitate bonding of wires to these areas or the deposition of Ti/Pd/Au beam leads into the areas. Care should be taken to insure that the side walls of the contact windows are at least vertical and not at re-entrant angles. This helps insure that only the silicon areas designated to be contacted are exposed. This leaves the wafers essentially hermetically sealed.

Using the second operating conditions as a standard, the effects of varying the five main process parameters, namely, (A) Gas pressure, (B) Total gas flow, (C) Pressure, (D) Substrate temperature and (E) RF input power into the reactor, were studied. The graphs illustrated in FIGS. 4, 5, 6, 7 and 8 each illustrate on the abscissa one of the variables denoted above, and on the respective ordinate axis some of the resulting characteristics of the film deposited on semiconductor wafers.

A. Gas Composition

Figure 4:
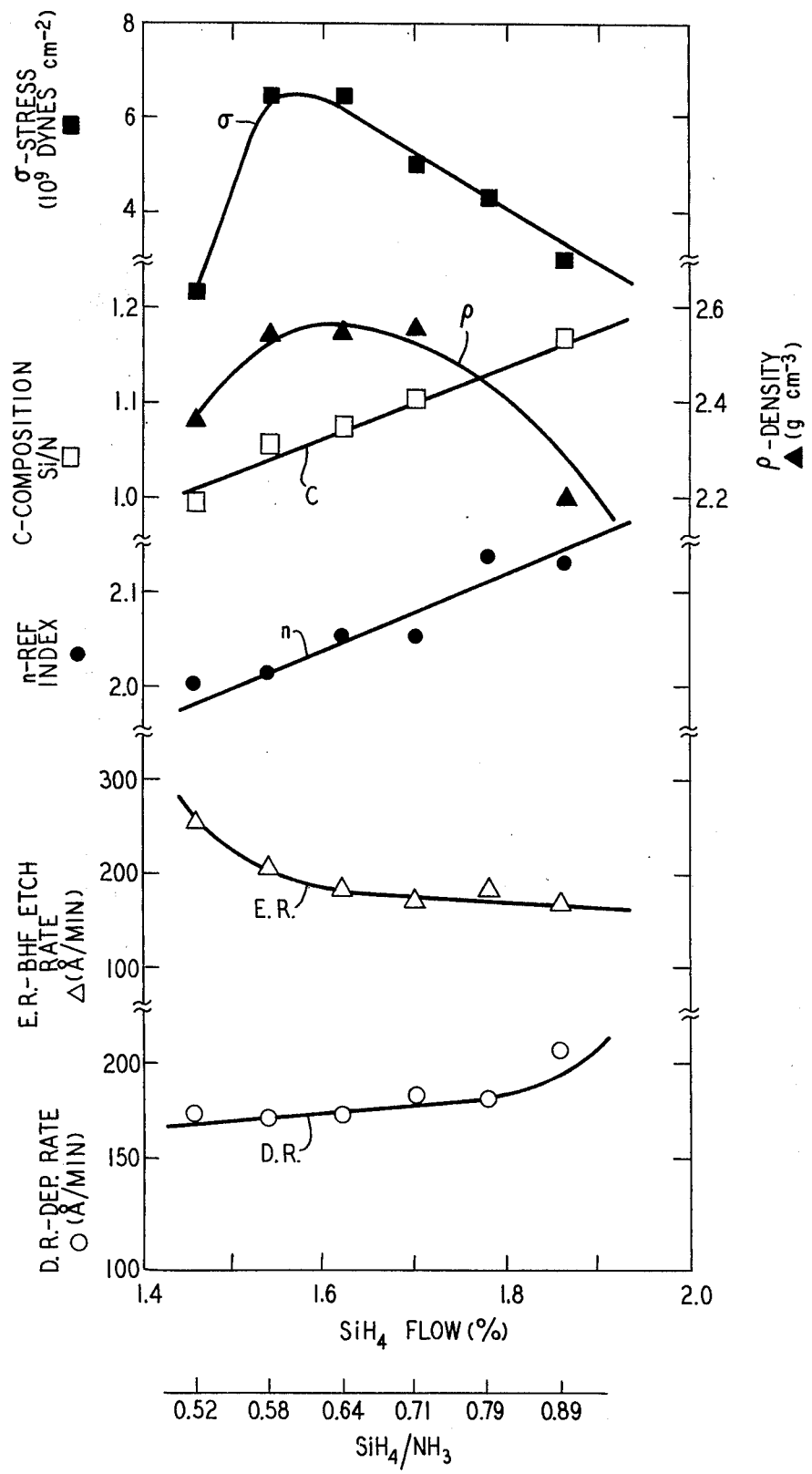
FIGS. 4, 5, 6, 7 and 8 each illustrate a separate graph which has as the abscissa axis one of the variables of a method for the deposition of films on semiconductor wafers, and as the ordinate axis, corresponding characteristics of the deposited film.

The graph of FIG. 4 illustrates the effect of increasing $SiH_4$ concentration ($1.4 \leq \% \ SiH_4 \leq 1.9$; $0.5 \leq SiH_4/NH_3 \leq 0.9$) in the reacting gases. These gas compositions were achieved by adjusting the flow-meters for 3% $SiH_4$ in Ar and 5% $NH_3$ in Ar to various complementary settings so as to keep the total flow constant.

As expected, increasing the $SiH_4$ concentration in the gas led to a corresponding linear increase in the Si/N ratio in the film (from $\approx 1.0$ to $\approx 1.2$), and a linear increase in the refractive index (from $\approx 1.9$ to $\approx 2.2$). For the lowest $SiH_4$ concentration used, ($SiH_4/NH_3 = 0.52$), the film density was found to be relatively low ($\approx 2.3 \ gcm^{-3}$), and the BHF etch-rate was correspondingly high (250 angstroms/min). With increasing $SiH_4/NH_3$ ratio, the film density $\rho$ showed a broad peak ($\rho \approx 2.55 \ gcm^{-3}$) for $0.58 \leq SiH_4/NH_3 \leq 0.79$. The $\rho$ decreased again at $SiH_4/NH_3 \approx 0.9$; however, this was not accompanied by corresponding increase in BHF etch-rate, presumably because the films now had a much higher Si content (Si/N$\approx$1.2). The film $\sigma$, which was always tensile, showed a peak at $SiH_4/NH_3 \approx 0.6$, which is located at a slightly lower $SiH_4$ concentration than that for the peak in $\rho$.

While most of the present work has involved operating conditions in which the ratio of silane to ammonia was between 0.5 and 0.9, which is believed the preferred range, it may be feasible to deposit useful protective film with ratios outside this range.

B. Gas Flow

Figure 5:
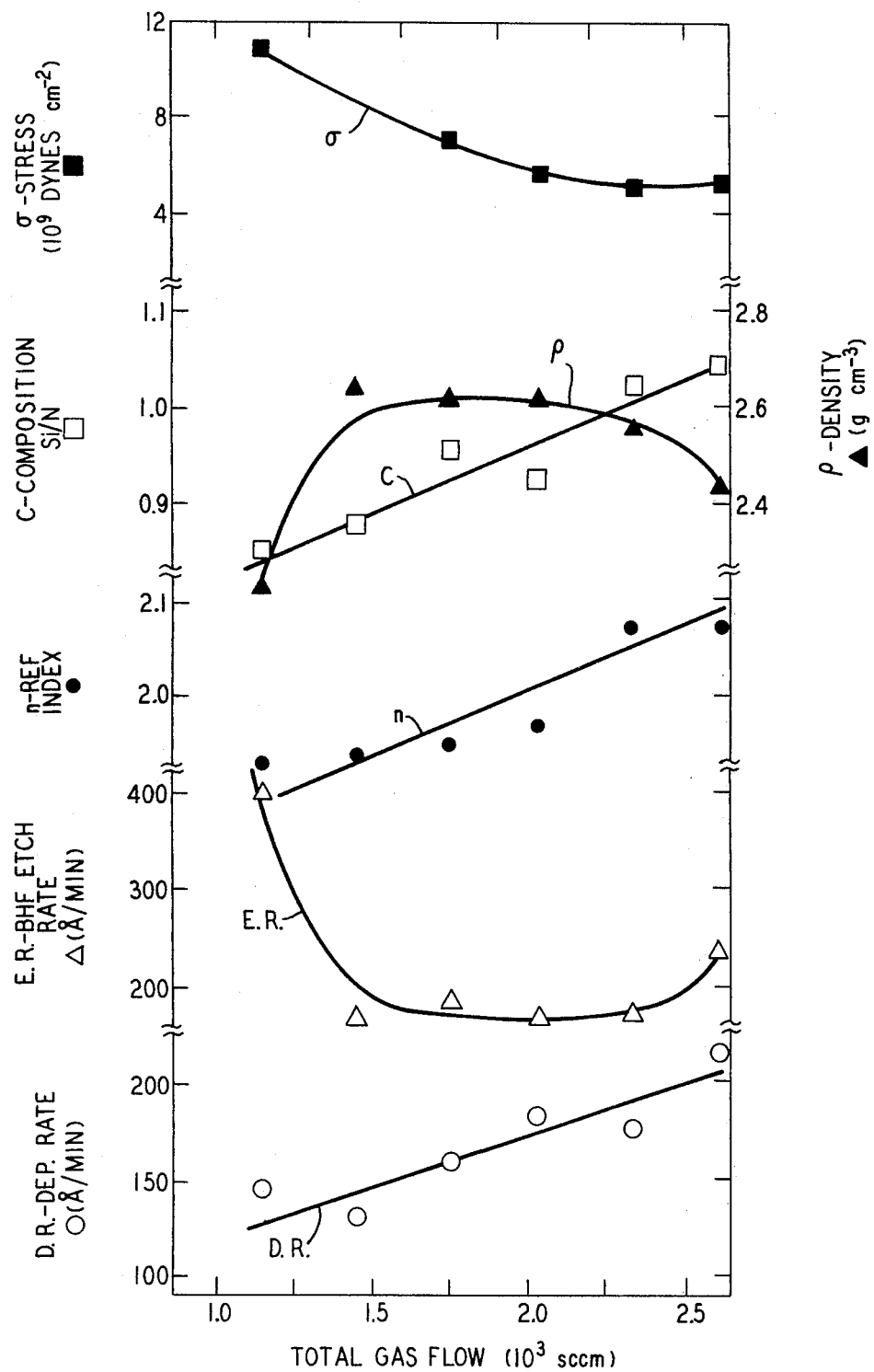

The graph of FIG. 5 illustrates the effect of increasing the total gas flow on the other variables of the process. The total gas flow was varied in the range 1.0 to 2.5 liters $min^{-1}$, with the $SiH_4/NH_3$ ratio constant at 0.71 (%$SiH_4$ = 1.70). It may be seen from FIG. 5 that increasing the flow led to a higher deposition rate (from 120 to 200 angstroms/min), a greater refractive index, and a larger Si/N ratio in the film (from 0.8 to 1.05). For this range of film composition, the film density seems to have a dominant effect on the BHF etch rate; a broad maximum in $\rho$ corresponds to a broad minimum in the etch rate. The tensile stress decreases with increasing flow; this is probably the result of a higher film purity (with respect to possible nitrogen/oxygen contamination) as the flow is increased.

C. Pressure

Figure 6:
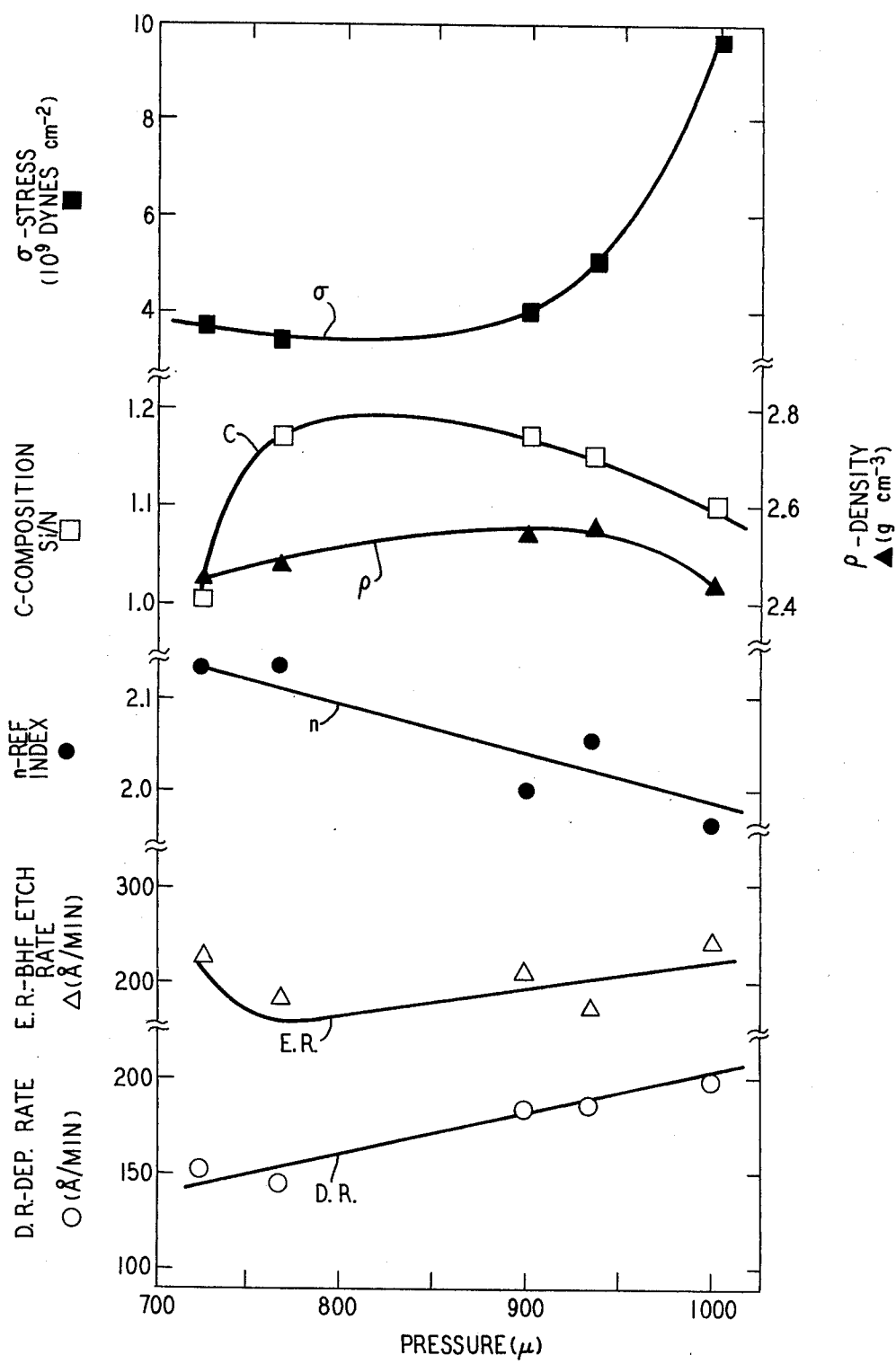

The graph of FIG. 6 illustrates the effect of increasing pressure on the other variables of the process. The average pressure during film deposition was varied from $\approx 700$ to $1000\mu$ ($\pm 25\mu$). As shown in FIG. 6, increasing the pressure also led to a higher deposition rate, whereas the density and the BHF etch rate did not change much. The refractive index decreased linearly. This generally (i.e., for pressures $\gtrsim 750\mu$) correlates with a decrease in the Si/N ratio in the film.

D. Substrate Temperature

Figure 7:
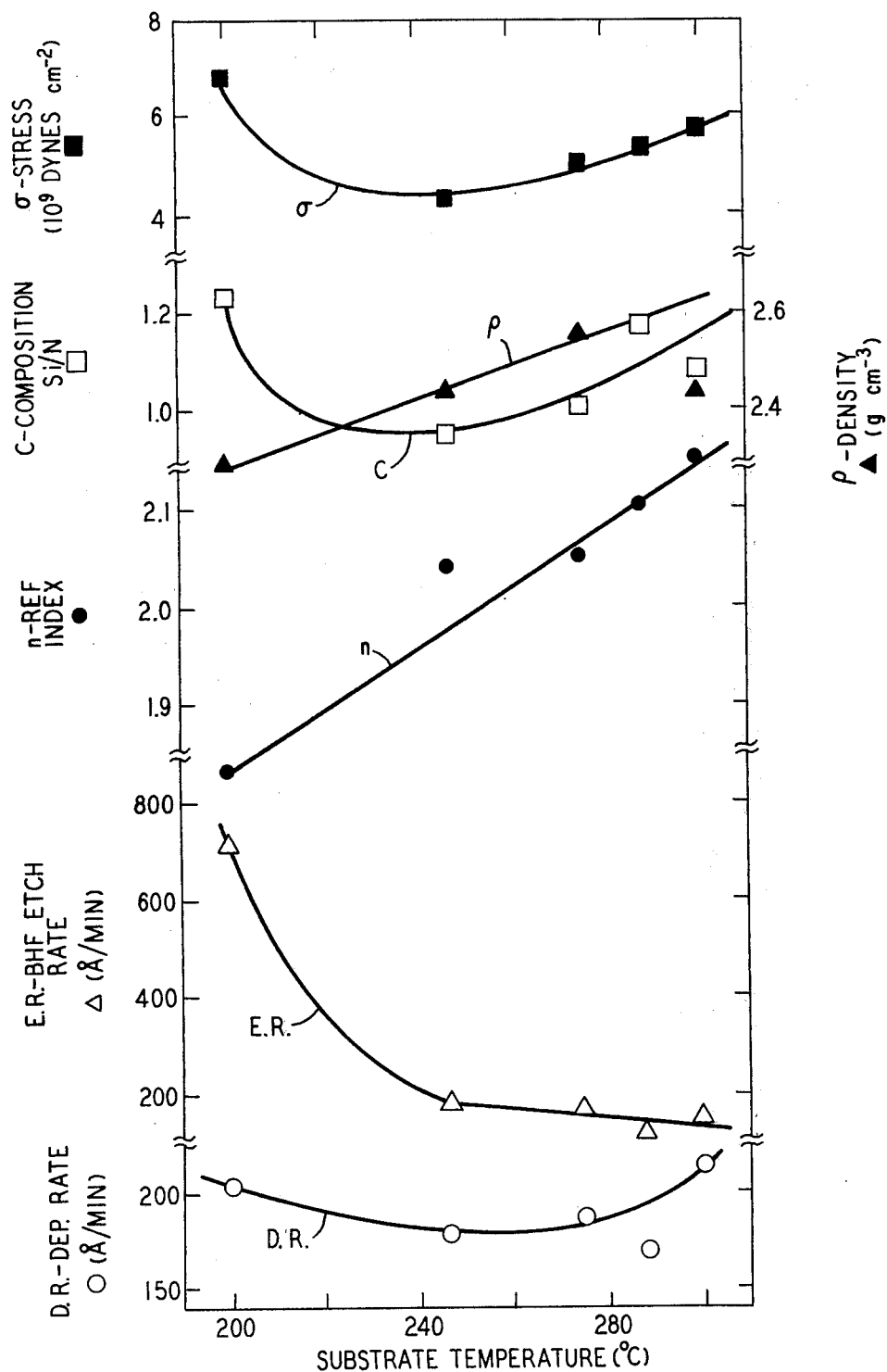

The graph of FIG. 7 illustrates the effects of varying the temperature of the semiconductor substrates on the other variables of the process. The limited range of substrate temperatures studied ($200 \leq T_S \leq 300$ degrees C.) was influenced by the desire to stay below temperatures at which Pd-Au interdiffusion (in Ti/Pd/Au metallization) becomes excessive. As shown in FIG. 7, $T_S$ (substrate temperature) has a pronounced effect on the BHF etch rate, which decreases almost exponentially with increasing $T_S$. The decrease in BHF etch-rate is associated with a linear increase in the film density, $\rho$, and the refractive index, n. Thus, for films deposited at 200 degrees C., the BHF etch rate was 700 angstroms/min, the density was $\approx 2.3 \ gcm^{-3}$ and the refractive index was $\approx 1.85$. Interestingly, these films also had a rather large Si/N ratio ($\approx 1.2$) and a high tensile stress ($7 \times 10^9$ dynes $cm^{-2}$). With increasing $T_S$, both $\sigma$ and the Si/N ratio in the film displayed a shallow minimum at $\approx 250$ degrees C.; however, a higher $T_S$ of 275 degrees C was preferred because it led to films with yet greater density (2.55 $gcm^{-3}$) and somewhat lower etch-rate without an excessive increase in $\sigma$.

E. RF Input Power

Figure 8:
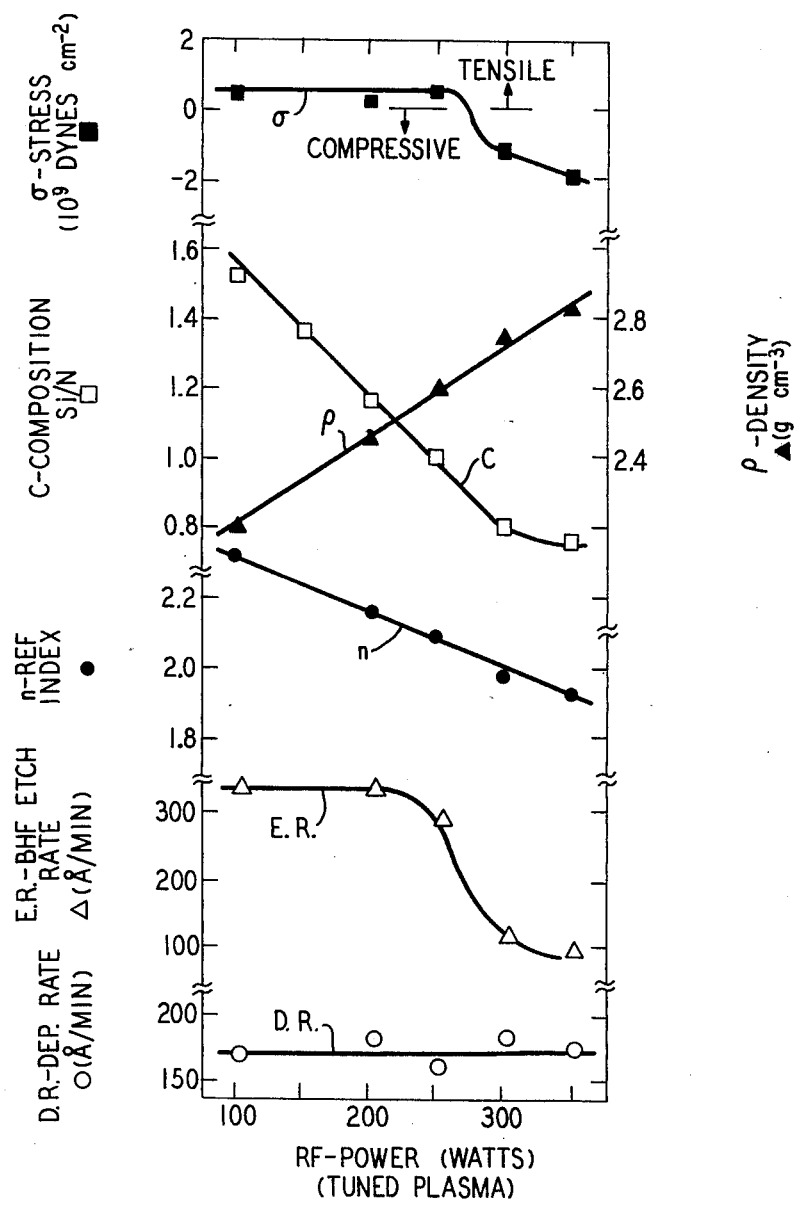

The graph of FIG. 8 illustrates the effect of increasing the rf input power. Tuned rf input powers were investigated in the range of 100 to 350 watts (reflected power $= \approx 0$). For this series of experiments, the $SiH_4/NH_3$ ratio was kept constant at 0.8, and %$SiH_4$ at 1.81. For increasing rf power, there was found to be a rapid and linear increase in the film $\rho$ (weight-gain measurements, using $1\mu$ thick films) from 2.2 $gcm^{-3}$ at 100 watts to 2.8 $gcm^{-3}$ at 350 watts. Films ($1\mu$) thick with lower density had a distinct yellowish tinge to them when deposited on Al-metallized devices, whereas those with densities $\gtrsim 2.4 \ gcm^{-3}$ appeared to be grayish and more truly transparent. Both the film $\sigma$ and BHF etch-rate showed a bimodal behavior at $\approx 275$ watts. Below this power level the stresses were very low tensile ($\approx 0.5 \times 10^9$ dynes $cm^{-2}$) and the etch-rates were relatively high (275 to 325 angstroms/min). At rf powers $\gtrsim 300$ watts, the stresses, which had been tensile, become compressive ($1-2 \times 10^9$ dynes $cm^{-2}$) and the BHF etch rates were relatively low (<150 angstroms/min). Significantly, the refractive index showed a decrease with increasing rf power. The refractive index, film composition, and film density have been correlated using the Lorentz-Lorenz equation.

It is believed that with increasing rf power, the plasma acquires a greater electron density, which causes a more complete decomposition of the reactants $SiH_4$ and $NH_3$. This condition leads to films with stoichiometric $Si_3N_4$ composition with essentially no hydrogen or argon incorporation and, therefore, excellent electrical insulating characteristics which are comparable to those of CVD-produced $Si_3N_4$.

It should be feasible to make changes in the reactor and in the gases employed without departing from the spirit and scope of the invention.

What is claimed is:

1. A method for providing a silicon-nitrogen coating resistant to cracking on a silicon substrate comprising the steps of
    placing the substrate in a nonsputtering type of radial flow reactor,
    evacuating the reactor to a high vacuum,
    heating the substrate to a temperature of about 300° C.
    introducing into the reactor a flow of gas comprising a mixture of argon, silane and ammonia and substantially free of oxygen and nitrogen, the ratio of silane to ammonia by volume being between 0.5 and 1.0, the rate of flow being at least 1500 SCCM, the dynamic pressure within the reactor being about 1000 microns, and the mixture being at least 95 percent argon, and
    applying radio frequency energy to the reactor of sufficient amount based on the size and spacing of the electrodes in said reactor to establish a plasma glow discharge in the region of the substrate for depositing a silicon-nitrogen film on the substrate having either a low tensile or a compressive stress and relatively high resistivity.

* * * * *